US012807475B2

(12) United States Patent
Dagher et al.

(10) Patent No.: US 12,807,475 B2
(45) Date of Patent: Nov. 24, 2026

(54) LOW NOISE ELECTROACOUSTIC TRANSDUCER AND METHOD FOR MANUFACTURING THE SAME

(71) Applicant: COMMISSARIAT À L'ENERGIE ATOMIQUE ET AUX ENERGIES ALTERNATIVES, Paris (FR)

(72) Inventors: Samer Dagher, Grenoble Cedex (FR); Loïc Joet, Grenoble Cedex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 655 days.

(21) Appl. No.: 18/324,533

(22) Filed: May 26, 2023

(65) Prior Publication Data

US 2023/0382715 A1 Nov. 30, 2023

(30) Foreign Application Priority Data

May 27, 2022 (FR) ....................................... 2205088

(51) Int. Cl.
*B81B 3/00* (2006.01)
*B81C 1/00* (2006.01)

(52) U.S. Cl.
CPC ........ *B81B 3/0021* (2013.01); *B81C 1/00158* (2013.01); *B81B 2201/0257* (2013.01); *B81B 2203/0127* (2013.01); *B81B 2203/0315* (2013.01); *B81B 2203/0361* (2013.01); *B81B 2203/04* (2013.01); *B81B 2207/11* (2013.01);
(Continued)

(58) Field of Classification Search
CPC . B81B 3/0021; B81B 3/0081; B81C 1/00158; H04R 19/005; H04R 31/00; G01H 11/06
See application file for complete search history.

(56) References Cited

U.S. PATENT DOCUMENTS 5,456,111 A * 10/1995 Hulsing, II ........... G01P 15/097 73/514.32
8,995,694 B2 * 3/2015 Vos ........................ B81B 3/0064 381/174
(Continued)

FOREIGN PATENT DOCUMENTS

| | | |
|---|---|---|
| CN | 113998663 A | 2/2022 |
| EP | 3 975 584 A1 | 3/2022 |
| FR | 3 059 659 A1 | 6/2018 |

OTHER PUBLICATIONS

Search Report as issued in French Patent Application No. FR2205088, dated Jan. 16, 2023.
(Continued)

*Primary Examiner* — Sue A Purvis
(74) *Attorney, Agent, or Firm* — CUSHMAN PARTNERS LLC

(57) ABSTRACT

An electroacoustic transducer includes a frame; an element movable relative to the frame, the movable element including a membrane; an internal cavity called back volume, subjected to a reference pressure and delimited by the movable element and walls belonging to the frame; in which transducer at least one of the walls delimiting the back volume includes at least one sealed cavity and in which a pressure lower than the reference pressure prevails in the at least one sealed cavity.

14 Claims, 5 Drawing Sheets

(52) U.S. Cl.
CPC ................. *B81C 2201/0104* (2013.01); *B81C 2201/0133* (2013.01); *B81C 2201/014* (2013.01)

(56) References Cited

U.S. PATENT DOCUMENTS

| | | | | |
|---|---|---|---|---|
| 11,661,336 | B2 * | 5/2023 | Joet | H04R 31/003 381/150 |
| 12,168,602 | B2 * | 12/2024 | Joet | H04R 31/00 |
| 12,215,022 | B2 * | 2/2025 | Dagher | B81B 7/02 |
| 2011/0293126 | A1 * | 12/2011 | Maekawa | H04R 19/005 381/355 |
| 2012/0260500 | A1 * | 10/2012 | Zhou | H01G 5/011 29/832 |
| 2014/0210018 | A1 * | 7/2014 | Dawson | B81C 1/00015 257/415 |
| 2015/0264463 | A1 * | 9/2015 | Kuzuyama | H04R 19/005 381/174 |
| 2017/0006368 | A1 * | 1/2017 | Brioschi | B81B 7/008 |
| 2017/0325012 | A1 | 11/2017 | Dehe et al. | |
| 2021/0292158 | A1 * | 9/2021 | Dagher | B81B 7/02 |
| 2024/0259734 | A1 * | 8/2024 | Vercesi | H04R 7/04 |

OTHER PUBLICATIONS

Yao, R., et al., "A Micro-Insulation Concept for MEMS Applications," Journal of Heat Transfer, vol. 131, No. 5, May 2009, Retrieved from the Internet: URL:https://blanchard.engr.wisc.edu/res/JHRBlanchard.pdf>, XP093012674, 7 pages.

* cited by examiner

-S10-

-S11-

-S12-

LOW NOISE ELECTROACOUSTIC TRANSDUCER AND METHOD FOR MANUFACTURING THE SAME

CROSS-REFERENCE TO RELATED APPLICATIONS

This application claims priority to French Patent Application No. 2205088, filed May 27, 2022, the entire content of which is incorporated herein by reference in its entirety.

FIELD

The technical field of the invention is that of microelectromechanical systems (MEMS) or nanoelectromechanical systems (NEMS) devices. The invention more particularly relates to an electroacoustic transducer comprising a movable element and a back volume, the back volume being delimited in part by the movable element and subjected to a reference pressure. Such an electroacoustic transducer can be employed as a microphone or loudspeaker.

BACKGROUND

Microelectromechanical or nanoelectromechanical microphones represent a rapidly growing market, especially by virtue of the development of nomadic apparatuses, such as tablets, smartphones and other connected objects, in which they are gradually replacing electret microphones.

Microphones measure a rapid change in atmospheric pressure, also known as acoustic pressure. They therefore include at least one part in contact with the outside.

Most MEMS or NEMS microphones manufactured today are capacitive detection microphones. Patent applications FR3059659A1 and EP3975584A1 describe an example of a capacitive detection microphone comprising a movable element, capacitive detection means and a device for transmitting movement between the movable element and the capacitive detection means.

The movable element is capable of collecting the pressure variation. It may be formed by a rigid piston comprising a membrane and a membrane rigidifying structure. The membrane forms a separation between a cavity open to the external environment and a back volume of the microphone, also called the reference volume because a reference pressure prevails therein. Thus, a face of the membrane is subjected to the reference pressure and an opposite face to the membrane is subjected to the atmospheric pressure (whose variation is desired to be detected). The back volume is usually connected to the external environment by a narrow acoustic path. The reference pressure is then equal to the atmospheric pressure filtered out of its dynamic (high frequency) components which do not have time to equilibrate. The pressure difference between both faces of the membrane hence corresponds only to these high frequency variations (the sound), the atmospheric pressure and its slow variations being cancelled out.

This capacitive detection microphone, like other electroacoustic transducers with a membrane and a back volume, suffers from acoustic noise. This acoustic noise adds to the useful signal at the output of the microphone and deteriorates its performance.

Document US2017/325012A1 describes another electroacoustic transducer comprising a frame, an element movable relative to the frame and an internal cavity delimited by the movable element and walls belonging to the frame. The frame comprises a substrate and a lid. An internal surface of the lid is made of a thermally insulating material, in order to reduce the frequency of gas pressure fluctuations within the internal cavity, and thus reduce noise.

SUMMARY

There is therefore a need to provide an electroacoustic transducer in which acoustic noise is reduced.

According to a first aspect of the invention, this need tends to be satisfied by providing an electroacoustic transducer comprising:

- a frame comprising a support, a first portion of a first structural layer disposed on the support and a cap disposed on the first portion of the first structural layer, the first structural layer having a thickness of less than 2 μm;
- an element movable relative to the frame, the movable element comprising a membrane;
- an internal cavity called back volume, subjected to a reference pressure and delimited by the movable element and first and second walls belonging to the frame, the first wall being located as an extension of the membrane and the second wall being arranged facing the membrane.

The first wall comprises at least one sealed cavity separated from the back volume by the first portion of the first structural layer, and a pressure lower than the reference pressure prevails in the at least one sealed cavity of the first wall.

The sealed cavity reduces heat exchange between the back volume and its boundaries, thereby reducing the associated acoustic noise (at a constant back volume). This alternatively allows to reduce the back volume, and hence the overall size of the microphone, for the same performance.

In an embodiment, the membrane is formed by a second portion of the first structural layer.

In an embodiment, the second wall comprises at least one sealed cavity, a pressure lower than the reference pressure prevails in the at least one sealed cavity of the second wall and the at least one sealed cavity of the second wall is located in the cap and separated from the back volume by a third structural layer with a thickness of less than 2 μm.

Further to the characteristics just discussed in the preceding paragraphs, the electroacoustic transducer according to the invention may have one or more complementary characteristics among the following, considered individually or according to any technically possible combinations:

- the pressure in the at least one sealed cavity is less than or equal to 1000 Pa (10 mbar), and in an embodiment less than or equal to 100 Pa (1 mbar);
- at least one of the first and second walls delimiting the back volume comprises a single sealed cavity, the single sealed cavity comprising pillars with a width of between 500 nm and 50 μm;
- at least one of the first and second walls delimiting the back volume comprises a plurality of sealed cavities separated from each other by partition walls having a width between 500 nm and 50 μm;
- the movable element further comprises a membrane rigidifying structure;
- the transducer further comprises a first transmission arm, the movable element being coupled to an end of the first transmission arm;
- the transducer further comprises a device for transmitting movement and force between a first zone and a second zone with a controlled atmosphere, the first and second zones being sealingly insulated from each other, the transmission device comprising, in addition to the first transmission arm extending into the first zone, a second transmission arm extending into the second zone.

A second aspect of the invention relates to a method for manufacturing an electroacoustic transducer comprising:

- a frame;
- an element movable relative to the frame, the movable element comprising a membrane;
- an internal cavity, called back volume, subjected to a reference pressure and delimited by the movable element and first and second walls belonging to the frame, the first wall being located as an extension of the membrane and the second wall being arranged facing the membrane;

the method comprising the following steps of:

- providing a stack successively comprising a substrate, a first sacrificial layer and a first structural layer having a thickness less than 2 μm;
- etching the first structural layer down to the first sacrificial layer so as to delimit the membrane of the movable element;
- transferring a cap onto the first structural layer, thus forming the back volume;
- etching the substrate to access the first sacrificial layer;
- etching the first sacrificial layer so as to release the membrane;

at least one sealed cavity being formed in a portion of the first sacrificial layer so as to be located in the first wall delimiting the back volume, the at least one sealed cavity of the first wall being separated from the back volume by a first portion of the first structural layer, and a pressure less than the reference pressure prevailing in the at least one sealed cavity of the first wall.

The substrate may be etched so as to delimit a transmission arm, the movable element being coupled to an end of the transmission arm, the first sacrificial layer serving as a stop layer in etching the substrate.

In an embodiment, the method further comprises, after the step of providing the stack and before the step of transferring the cap, the following steps of:

- forming a second sacrificial layer on the first structural layer;
- forming a second structural layer on the first structural layer and on the second sacrificial layer;
- etching the second structural layer so as to expose the second sacrificial layer and delimit a structure for rigidifying the membrane;
- etching the second sacrificial layer so as to expose the membrane.

Beneficially, the first structural layer and the second structural layer are etched simultaneously so as to delimit the membrane and the rigidifying structure of the movable element.

In an embodiment of the method, the step of providing the stack comprises the following sub-steps of:

- etching first and second disjointed cavities in the substrate;
- forming the first sacrificial layer on the substrate, the first sacrificial layer comprising a first portion disposed in the first cavity and a second portion disposed in the second cavity; and
- etching at least one third cavity in the first portion of the first sacrificial layer;
- transferring the first structural layer onto the first and second portions of the first sacrificial layer, so as to seal the at least one third cavity.

The manufacturing method may further comprise a step of providing the cap comprising the following sub-steps of:

- etching at least one fourth cavity into an additional substrate;
- transferring a third structural layer onto the additional substrate, so as to seal the at least one fourth cavity.

The invention and its different applications will be better understood upon reading the following description and upon examining the accompanying figures.

BRIEF DESCRIPTION OF THE FIGURES

Further characteristics and benefits of the invention will become clearer from the description thereof given below, by way of indicating and in no way limiting purposes, with reference to the appended figures, of which.

For more clarity, identical or similar elements are marked with identical reference signs throughout the figures.

DETAILED DESCRIPTION

Figure 1:
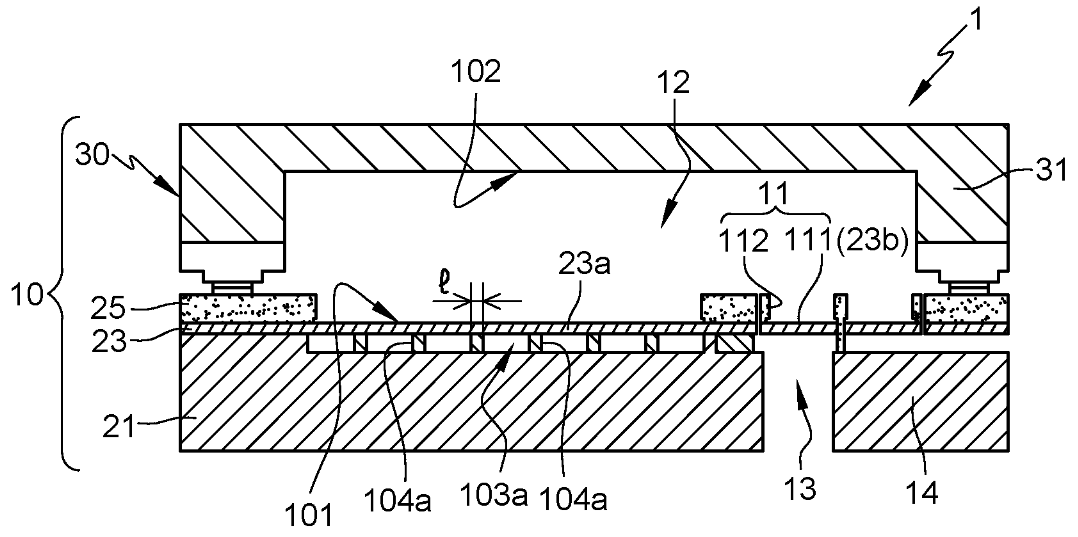
FIG. 1 represents a cross-section view of an electroacoustic transducer according to a first embodiment of the invention.
Figure 2:
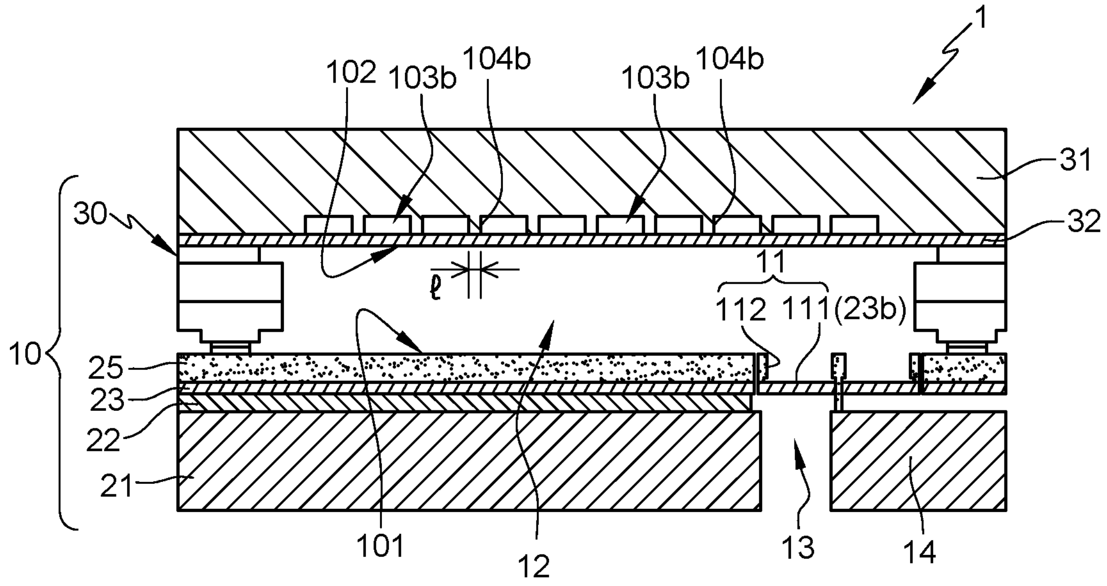
FIG. 2 represents a cross-section view of an electroacoustic transducer according to a second embodiment of the invention.
Figure 3:
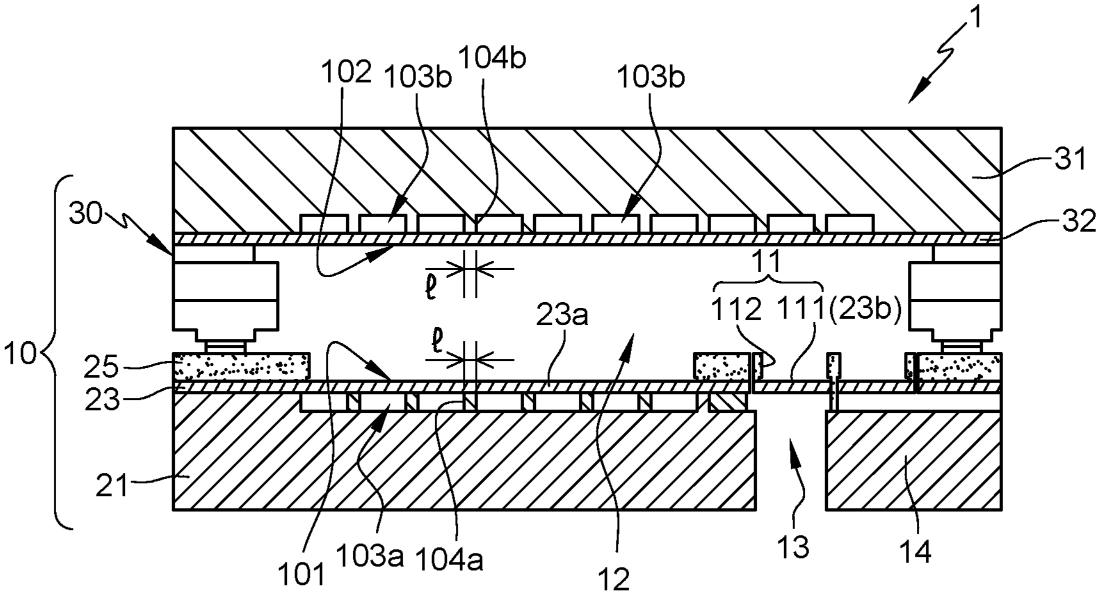
FIG. 3 represents a cross-section view of an electroacoustic transducer according to a third embodiment of the invention.

FIGS. 1, 2 and 3 represent different embodiments of a low noise electroacoustic transducer 1.

In common to these three embodiments, the electroacoustic transducer 1 comprises a frame 10, an element 11 movable relative to the frame 10 and a first so-called internal cavity 12 where a reference pressure prevails.

The movable element 11, hereinafter referred to as piston, comprises a membrane 111 and a rigidifying structure 112 for rigidifying the membrane 111.

The membrane 111 of the piston 11, also referred to as a thin layer, is able to move or deform under the effect of a pressure difference between its two faces. It separates the first cavity 12 from a second cavity 13. In the case of an electroacoustic transducer of the microphone or loudspeaker type, the second cavity 13 is open to the external environment, that is the air. One face of the membrane 111 is therefore subjected to the reference pressure and an opposite face of the membrane 111 is subjected to atmospheric pressure.

The first cavity 12 is commonly referred to as the back volume (referring to its position behind the piston). This back volume 12 may be connected to the second cavity 13 through an acoustic path, for example located at the periphery of the piston 11 as represented in FIGS. 1 to 3. This acoustic path is dimensioned so that the reference pressure is equal to the atmospheric pressure filtered from its dynamic (high frequency) components. The pressure difference between both faces of the membrane 111 is then equal to the dynamic components of atmospheric pressure (which constitute sound).

Alternatively, the back volume 12 can be sealed. The reference pressure is then decorrelated from the atmospheric pressure.

When the membrane 111 moves as a result of the pressure differential, the back volume 12 is compressed or stretched, its pressure changes. In other words, part of the pressure change is transmitted to the back volume 12 via the membrane 111. The pressure changes cause temperature changes within the back volume 12, which in turn cause heat dissipation at the boundaries of the back volume 12. It is this thermal dissipation that causes the acoustic noise experienced by the electroacoustic transducer.

The larger the back volume 12, the less sensitive the electroacoustic transducer 1 is to temperature variations in the back volume 12. A good compromise between sensitivity to temperature variations and overall size of the electroacoustic transducer 1 can be obtained for a back volume 12 of between 1 $mm^3$ and 100 $mm^3$.

The back volume 12 is delimited by the mobile element 11 and by walls belonging to the frame 10. The back volume 12 is especially delimited by a first wall 101 located as an extension of the membrane 111 and by a second wall 102 arranged facing the membrane 111. In other words, the first wall 101 and the membrane 111 are located on a same side of the back volume 12 and the second wall 102 is located on the opposite side.

In order to reduce acoustic noise generated by heat dissipation during temperature variations in the back volume 12, at least one of the walls delimiting the back volume 12 comprises at least one sealed cavity 103*a*, 103*b*. Each sealed cavity 103*a*, 103*b* is filled with a gas or a gas mixture, for example air, which exerts a (strictly) lower pressure on the walls of the sealed cavity 103*a*, 103*b* than the reference pressure. In other words, a pressure (strictly) lower than the reference pressure prevails in the sealed cavity 103*a*, 103*b*.

Each sealed cavity 103*a* or 103*b* within a wall of the back volume 12 reduces heat dissipation through that wall. In other words, the sealed cavity 103*a*, 103*b* improves thermal insulation of the wall. This results in a decrease in acoustic noise at the output of the electroacoustic transducer.

The lower the pressure in the sealed cavity 103*a*, 103*b*, the lower the heat dissipation. The pressure in the sealed cavity 103*a*, 103*b* is beneficially less than 1000 Pa (10 mBar).

The pressure prevailing in the sealed cavity 103*a*, 103*b* may be very low, in order to achieve a near-vacuum configuration. It is then less than or equal to 100 Pa (1 mbar).

In an embodiment, the sealed cavity 103*a*, 103*b* extends parallel to at least one of the surfaces of the back volume 12.

A wall delimiting the back volume 12 may comprise a single sealed cavity 103*a*, 103*b* within which pillars 104*a*, 104*b* (also referred to as columns) are arranged. These pillars 104*a*, 104*b* improve mechanical strength of the wall. They have a width l which is beneficially between 500 nm and 50 μm. The width l, also called critical dimension, is the smallest dimension of the pillars 104*a*, 104*b* in a plane parallel to the faces of the membrane 111. Such a width offers a good compromise between mechanical strength of the wall (at the reference pressure) and thermal conduction.

Alternatively, the wall may comprise several sealed cavities 103*a*, 103*b* separated from each other by partition walls whose width 1 is beneficially between 500 nm and 50 μm. The different sealed cavities 103*a* or 103*b* within the same wall may have identical shape and dimensions.

The number of pillars 104*a*, 104*b* (or partition walls) per unit area depends on the compromise between mechanical strength of the wall and thermal conductivity.

In order to significantly reduce heat dissipation, the sealed cavity or cavities 103*a*, 103*b* extend into at least one of the first and second walls 101-102. These walls, referred to as the main walls, are those with the largest surface areas.

Thus, in the embodiment represented in FIG. 1, only the first wall 101 as an extension of the membrane 111 comprises one or more sealed cavities 103*a*. Conversely, in the embodiment of FIG. 2, only the second wall 102 comprises one or more sealed cavities 103*b*. Finally, in the embodiment of FIG. 3, the first wall 101 comprises one or more (first) sealed cavities 103*a* and the second wall 102 comprises one or more (second) sealed cavities 103*b*. The number, shape and/or dimensions of the sealed cavities 103*a*, 103*b* may differ between the walls.

In these three embodiments, the frame 10 comprises a support 21, a first portion 23*a* of a first structural layer 23 disposed on the support 21 and a cap 30 disposed on the first portion 23*a* of the first structural layer 23. In an embodiment, the support 21 is formed by a first substrate (for example made of silicon) and the cap 30 comprises a second substrate 31 (for example made of silicon).

The frame 10 may further comprise a second structural layer 25 disposed between the first portion 23*a* of the first structural layer 23 and the cap 30.

The sealed cavity 103*a* of the first wall 101 is, in the embodiments of FIGS. 1 and 3, separated from the back volume 12 by the first portion 23*a* of the first structural layer 23. In other words, the first portion 23*a* of the first structural layer 23 constitutes the "ceiling" of the sealed cavity 103*a*. The pillars 104*a* disposed within the sealed cavity 103*a* (or the partition walls separating the sealed cavities 103*a*) extend from the support 21 to the first portion 23*a* of the first structural layer 23. The pillars 104*a* thus support the first portion 23*a* and prevent it from collapsing, due to the pressure difference between the back volume 12 and the sealed cavities 103*a*.

Beneficially, the first structural layer 23 has a thickness of 2 μm or less. Thus, the first wall 101 has a low thermal inertia. The membrane 111 of the piston 11 is in an embodiment formed by a second portion 23*b* of the first structural layer 23.

In the embodiments of FIGS. 2 and 3, the second wall 102 belongs to the cap 30. The sealed cavity 103*b* of the second wall 102 is therefore located in the cap 30 and is beneficially separated from the back volume 12 by a third structural layer 32 having a thickness of less than 2 μm. The third structural layer 32 (belonging to the cap 30) is arranged on the second substrate 31. The pillars 104*b* arranged within the sealed cavity 103*b* support the third structural layer 32.

The electroacoustic transducer 1 may be a capacitive detection microphone. In addition to the piston 11, the electroacoustic transducer 1 then comprises capacitive detection means and a device for transmitting movement between the movable element and the capacitive detection means.

The piston 11 is connected to the movement transmitting device in a first zone of the microphone, herein the second cavity 13.

The capacitive detection means make it possible to measure the displacement of the piston 11 and thus the variation in atmospheric pressure. They are disposed in a second zone of the microphone, sealingly isolated from the first zone 13 and not represented in the figures. They comprise a movable electrode and at least one fixed electrode arranged facing the movable electrode. The electrodes form the plates of a capacitor whose capacitance varies according to the displacement of the piston 11. The second zone is in an embodiment a controlled atmosphere chamber in order to reduce the phenomena of viscous friction and the associated acoustic noise. By "controlled atmosphere chamber", it is meant a chamber under reduced pressure, typically less than 1000 Pa (10 mbar), and in an embodiment under vacuum (<100 Pa or 1 mbar).

The transmission device comprises at least one first transmission arm 14 extending into the first zone 13 and at least one second transmission arm extending into the second zone. The piston 11 is coupled to a first end of the first transmission arm 14, while the movable electrode of the capacitive detection means is coupled to an end of the second transmission arm. The first and second transmission arms are connected at their second end through a pivot hinge. This pivot hinge allows rotation of the transmission arms relative to the microphone frame 10 and simultaneously ensure sealing of the first and second zones.

FIGS. 4A to 4L represent steps S1 to S12 of a method for manufacturing the electroacoustic transducer 1 according to FIG. 1, according to an embodiment of the invention.

The steps S1 to S5, illustrated in FIGS. 4A-4E, are related to the formation of a stack 20 successively comprising the substrate 21, a first sacrificial layer 22 and the first structural layer 23, as well as to the formation of the sealed cavities 103*a* in a portion of the first sacrificial layer 22.

Figure 4A:
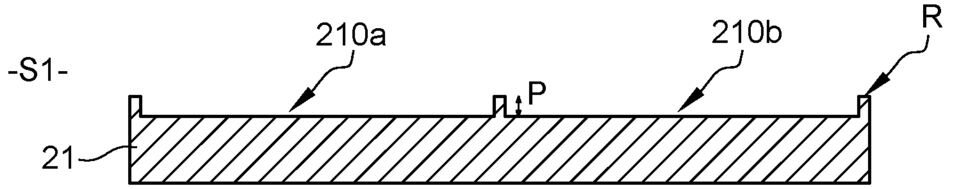
FIG. 4A to FIG. 4L represents a cross-section view of steps of a method for manufacturing the electroacoustic transducer according to FIG. 1.

Thus, with reference to FIG. 4A, the manufacturing method begins with a step S1 of etching a first cavity 210*a* and a second cavity 210*b* into the substrate 21. The first and second cavities 210*a*-210*b* are disjointed, that is they are separated by a portion of the substrate 21. In an embodiment, they have the same depth P, for example between 100 nm and 10 μm. The depth P of the first and second cavities 210*a*-210*b* is measured from the initial surface of the substrate 21, hereinafter called the reference surface R.

The substrate 21 serves especially to produce the first transmission arm 14 and a part of the frame (the support). It initially has a thickness which may be between 500 μm and 700 μm. The substrate 21 is in an embodiment a so-called "bulk" semiconductor substrate, for example made of silicon.

Figure 4B:
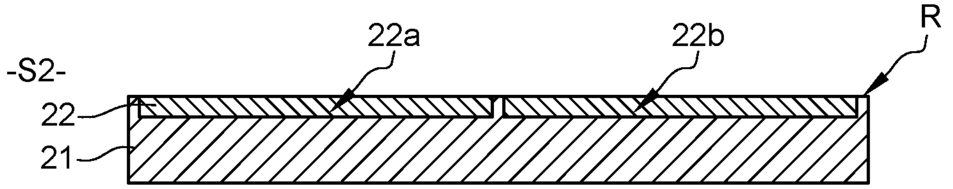

Then, in step S2 of FIG. 4B, the first sacrificial layer 22 is formed on the substrate 21. The first sacrificial layer 22 comprises a first portion 22*a* disposed in the first cavity 210*a* and a second portion 22*b* disposed in the second cavity 210*b*. The first and second portions 22*a*-22*b* of the first sacrificial layer 22 in an embodiment have the same thickness.

Beneficially, the first sacrificial layer 22 is deposited so as to completely fill the first and second cavities 210*a*-210*b* of the substrate 21. For example, the first sacrificial layer 22 is formed by plasma enhanced chemical vapour deposition (or PECVD) and then annealing. This deposition operation is followed by a planarisation operation, for example by chemical mechanical polishing (CMP), in order to obtain a planar surface with the reference surface R of the substrate 21.

The first sacrificial layer 22 is intended to disappear in part upon making the transducer. This layer is especially useful for delimiting the first transmission arm 14. It can also serve as a lower air gap in the capacitive detection zone of the transducer (not represented in the figures). It may also serve to mechanically connect the substrate 21 and the first structural layer 23. The first sacrificial layer 22 may be made of a dielectric material, for example a silicon nitride or a silicon oxide, for example silicon dioxide ($SiO_2$). Its thickness is for example between 100 nm and 10 μm.

Figure 4C:
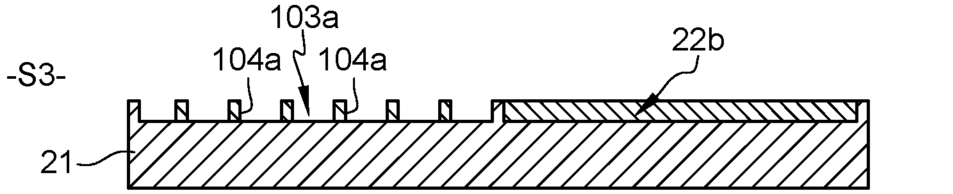

Step S3 of FIG. 4C consists of etching at least one cavity 103*a* in the first portion 22*a* of the first sacrificial layer 22. The cavity 103*a* in an embodiment extends to the substrate 21. It contains pillars 104*a* at least partly formed of the material of the first sacrificial layer 22. In other words, the first portion 22*a* of the first sacrificial layer 22 is structured in the form of pillars 104*a*. Alternatively, the first portion 22*a* of the first sacrificial layer 22 is etched in the form of partition walls separating different cavities 103*a*.

The first portion 22*a* of the first sacrificial layer 22 is in an embodiment etched selectively with respect to the substrate 21. The pillars 104*a* or partition walls are then formed solely from the material of the first sacrificial layer 22.

The pillars 104*a* or partition walls may have different shapes. For example, the pillars 104*a* are cylinders with a round, square or octagonal cross-section. The partition walls are, for example, lines parallel to each other. The partition walls may also form a grid (lines extending in two intersecting, in an embodiment perpendicular, directions), each mesh of the grid hence corresponding to a cavity 103*a*.

Figure 4D:
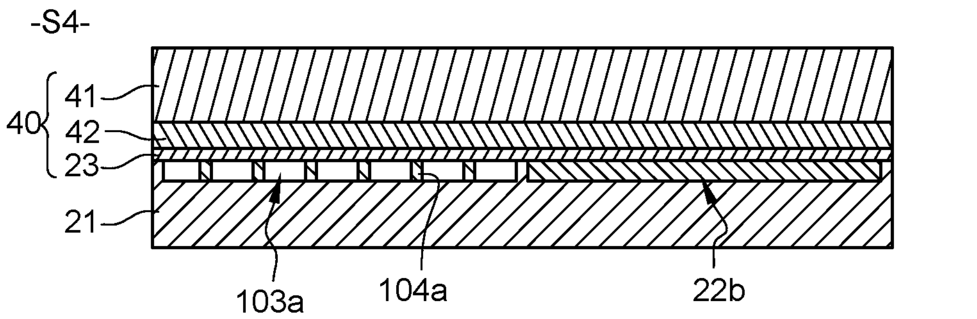
Figure 4E:
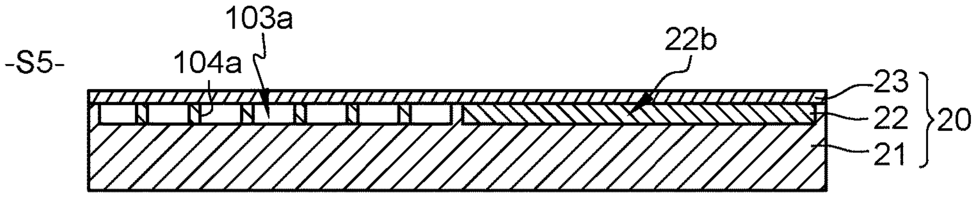

The method for manufacturing then comprises a step of transferring the first structural layer 23 onto the first portion 22*a* of the first sacrificial layer 22 (pillars 104*a* or partition walls) and onto the second portion 22*b* of the first sacrificial layer 22, so as to close the cavity(ies) 103*a* in a tight manner (FIG. 4E). The first structural layer 23 may be made of the same material as the substrate 21, for example silicon.

FIGS. 4D and 4E represent an embodiment of this transfer step. The first structural layer 23 initially belongs to a transfer substrate 40. It is transferred to the first and second portions 22*a*-22*b* of the first sacrificial layer 22 by virtue of a direct bonding technique.

Thus, in step S4 of FIG. 4D, the transfer substrate 40 is bonded to the substrate 21 covered with the first sacrificial layer 22 by contacting the first structural layer 23 with the pillars 104*a* and the second portion 22*b* of the first sacrificial layer 22.

And then, in step S5 of FIG. 4E, the transfer substrate 40 is thinned to the first structural layer 23. Thinning of the transfer substrate 40 may be accomplished by etching or by grinding and CMP.

The transfer substrate 40 is in an embodiment a multilayer SOI type structure successively comprising a support layer 41 (typically silicon), a buried oxide layer 42 (typically $SiO_2$) and a thin film of silicon forming the first structural layer 23. The transfer substrate 40 is thinned by successively removing the support layer 41 and the buried oxide layer 42.

The first structural layer 23 especially serves to produce the membrane 111 of the piston 11. It may also serve to produce the movable electrode of the capacitive detection means. It has a thickness less than that of the substrate 21, in an embodiment between 100 nm and 10 μm, and in an embodiment less than or equal to 2 μm.

The method for manufacturing continues with steps S6 to S12 described below in connection with FIGS. 4F to 4L.

Figure 4F:
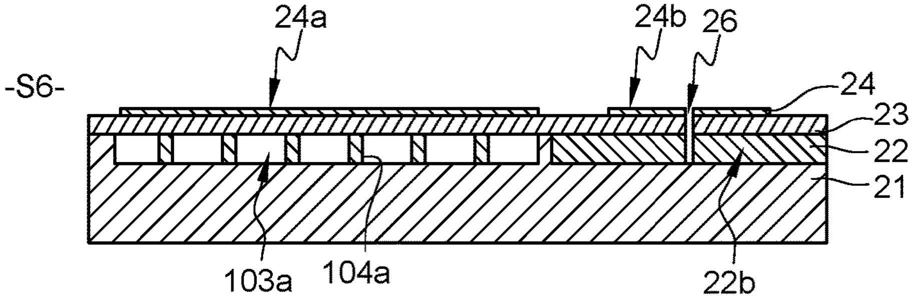

In step S6 of FIG. 4F, a second sacrificial layer 24 is formed on the first structural layer 23. The second sacrificial layer 24 comprises a first portion 24*a* disposed facing the sealed cavities 103*a* and a second portion 24*b* disposed facing the second portion 22*b* of the first sacrificial layer 22. The first and second portions 24*a*-24*b* of the second sacrificial layer 24 are disjointed.

The second sacrificial layer 24 may be first deposited to fully cover the first structural layer 23 and then partially etched, for example through a resin mask formed by photolithographically, to form the first and second portions 24*a*-24*b*. The etching of the second sacrificial layer 24 is in an embodiment selective with respect to the first structural layer 23. The second sacrificial layer 24 is beneficially formed from the same dielectric material as the first sacrificial layer 22, for example a silicon oxide. Its thickness may be between 100 nm and 10 μm.

The second sacrificial layer 24 may serve as an upper air gap for capacitive detection.

Figure 4G:
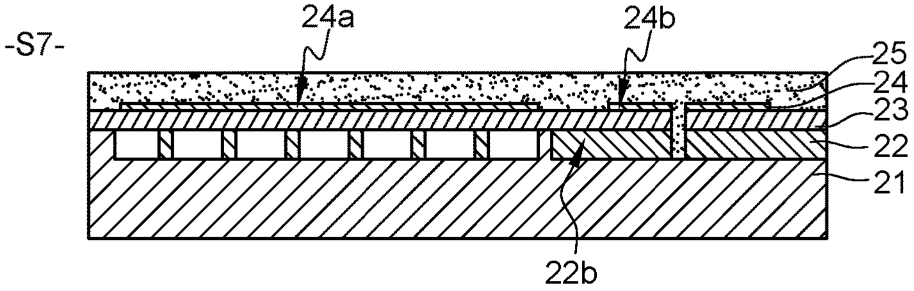

In step S7 of FIG. 4G, a second structural layer 25 is formed on the first structural layer 23 and the second sacrificial layer 24, for example by epitaxy. The second structural layer 25 is intended to form one or more (structural) elements of the transducer, in particular the rigidifying structure 112 of the piston 11. It is beneficially made of the same material as the first structural layer 23, for example silicon. The thickness of the second structural layer 25 is in an embodiment between 5 μm and 50 μm, for example 20 μm.

Before step S7 of forming the second structural layer 25, the method for manufacturing may comprise a so-called step of opening the first structural layer 23 and the second portion 22*b* of the first sacrificial layer 22. This opening step consists of forming a well 26 that extends through the first structural layer 23 and the second portion 22*b* of the first sacrificial layer 22 to the substrate 21. This well 26 is formed by successively etching the first structural layer 23 and the second portion 22*b* of the first sacrificial layer 22, in an embodiment through the second portion 24*b* of the second sacrificial layer 24. The well 26 allows the material of the second structural layer 25 (for example silicon) to grow from the substrate 21 to the first structural layer 23, forming a pillar that passes through the second portion 22*b* of the first sacrificial layer 22. This pillar will provide connection between the membrane 111 of the piston 11 (formed in the first structural layer 23) and the first transmission arm 14 (formed in the substrate 21).

Figure 4H:
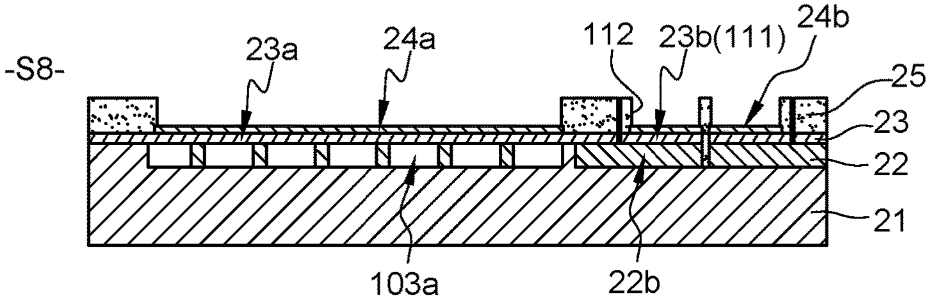

And then, in a step S8 represented by FIG. 4H, the second structural layer 25 is etched so as to delimit the contours of the rigidifying structure 112 (trimming of the piston), to lighten the piston 11 and to reduce the volume of material above the sealed cavity 103*a*. The first and second portions 24*a*-24*b* of the second sacrificial layer 24 (for example silicon oxide) serve as a stop layer in etching the second structural layer 25 (for example silicon), thereby keeping the underlying first structural layer 23 (for example silicon). The etching of the second structural layer 25 is thus selective with respect to the second sacrificial layer 24.

In contrast, between the first and second portions 24*a*-24*b* of the second sacrificial layer 24, etching of the second structural layer 25 to delimit the periphery (or external contour) of the rigidifying structure 112 opens onto the first structural layer 23. Since etching of the second structural layer 25 is not selective with respect to the first structural layer 23 (but only with respect to the first and second sacrificial layers 22, 24), the first structural layer 23 is etched together with the second structural layer 25 down to the second portion 22*b* of the first sacrificial layer 22.

Thus, at the bottom of the trench corresponding to the periphery of the rigidifying structure 112, the first structural layer 23 has been etched and the second portion 22*b* of the first sacrificial layer 22 is exposed.

At the end of step S8, the first structural layer 23 comprises a first portion 23*a* and a second portion 23*b* separated from each other. The first portion 23*a* of the first structural layer 23 (on the left in FIG. 4H) covers the sealed cavity 103*a*. It is covered with the first portion 24*a* of the second sacrificial layer 24 and by a residual portion of the second structural layer 25. The second portion 23*b* of the first structural layer 23 (right) is intended to form the membrane 111 of the piston 11. It is covered by the second portion 24*b* of the second sacrificial layer 24 and with a portion integral with the second structural layer 25 forming the rigidifying structure 112.

The etching technique used in step S8 of FIG. 4H is beneficially Deep Reactive Ion Etching (DRIE).

The etching of the first structural layer 23 beneficially opens onto the second portion 22*b* of the first sacrificial layer 22.

Alternatively, the second structural layer 25 and the first structural layer 23 may be etched separately, using different etching chemistries, when both layers are made of different materials.

Figure 4I:
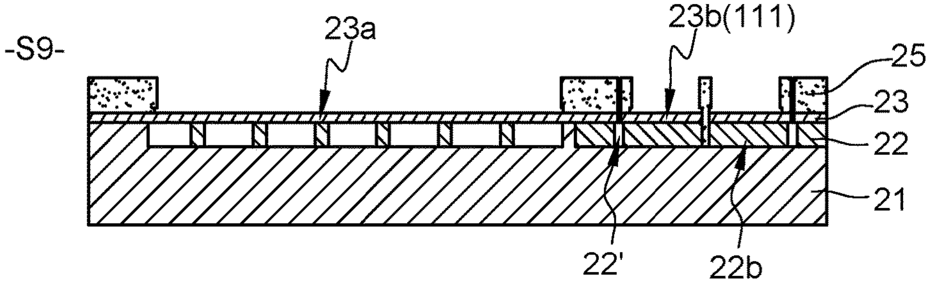

With reference to FIG. 4I, the method for manufacturing then comprises a step S9 of etching the second sacrificial layer 24 so as to (partially) expose the second portion 23*b* of the first structural layer 23 (in other words so as to expose a first face of the membrane 111). This step S9 may be referred to as the first step of releasing the piston 11. The first portion 23*a* of the first structural layer 23 is also exposed as a result of this step.

Etching of the second sacrificial layer 24 is in an embodiment isotropic etching selective with respect to the substrate 21, the first structural layer 23 and the second structural layer 25. The second sacrificial layer 24 is in an embodiment etched chemically, for example by immersing the stack in a hydrofluoric acid (HF) bath in the liquid or vapour phase (in the case of a silicon oxide layer) for a controlled time.

In contrast, part of the first sacrificial layer 22 (more particularly of the second portion 22*b*) located vertically aligned with the periphery of the rigidifying structure 112 is etched at the same time as the second sacrificial layer 24, thereby forming a cavity 22' in the first sacrificial layer 22. The etching can be controlled in time so that this cavity 22' is of low extension.

The etching of the sacrificial layers 22 and 24 may also serve to release the movable electrode from the capacitive detection means (before it is enclosed in the controlled atmosphere chamber).

Figure 4J:
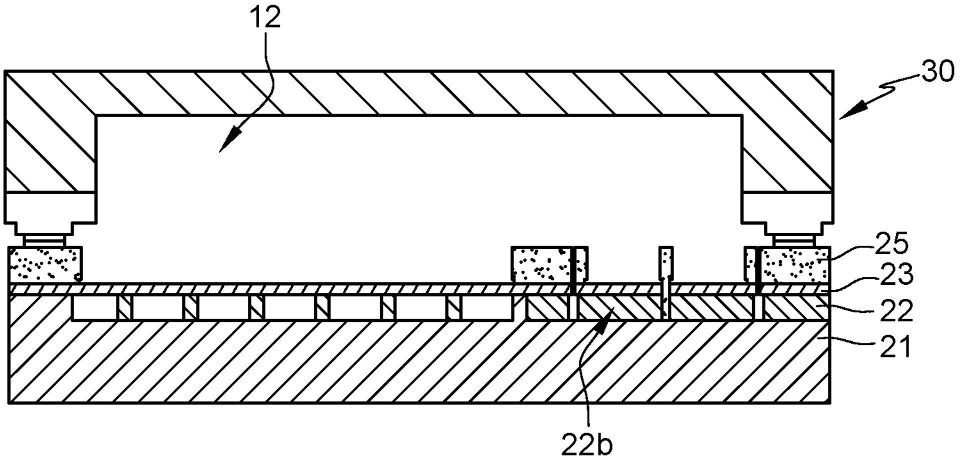

With reference to FIG. 4J, the manufacturing method then comprises a step S10 of transferring the cap 30 onto the part of the second structural layer 25 belonging to the frame 10, thus forming the back volume 12 (and the controlled atmosphere chamber). The cap 30 may especially be attached to the second structural layer 25 by direct bonding (for example Si—Si) or by eutectic sealing (for example Au—Si or Al—Ge).

The assembly formed by the stack of layers 21-25 and the cap 30 may then be flipped over, to facilitate subsequent etching of the substrate 21. After this flipping, the substrate 21 is beneficially thinned, for example by DRIE etching or by grinding and then CMP, and in an embodiment to a thickness of between 30 μm and 300 μm, that is the desired thickness for the first transmission arm 14.

Figure 4K:
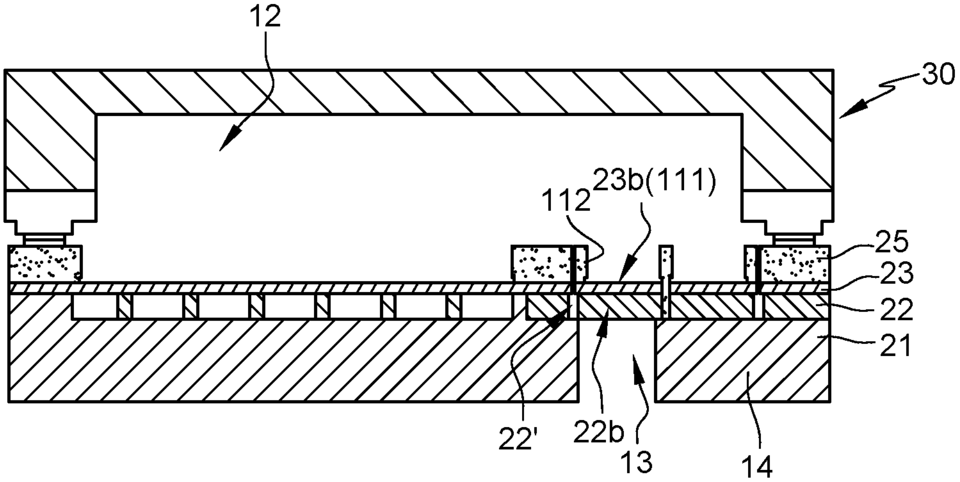
Figure 4L:
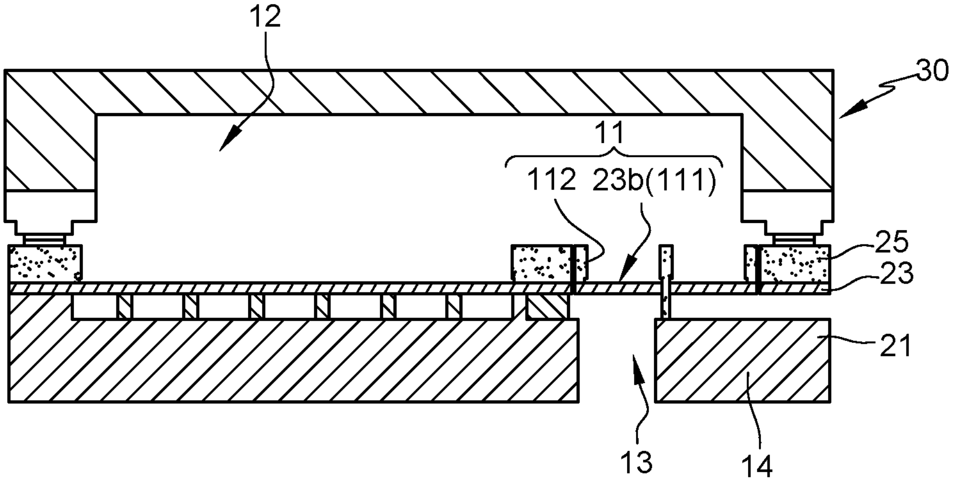

Step S11 of FIG. 4K consists in etching the substrate 21 (possibly thinned) down to the first sacrificial layer 22 so as to create access to the piston 11 and to delimit the first transmission arm 14. The etching of substrate 21 is in an embodiment selective with respect to the first sacrificial layer 22. The substrate 21 may be etched by DRIE.

As illustrated in FIG. 4K, the etching of the substrate 21 to create access to the rear face of the piston 11 may be inscribed within the periphery of the piston 11, so as not to open into the cavity 22' formed in step S9 (see FIG. 4I) by the partial (and unintended) etching of the first sacrificial layer 22. Thus, the etching of step S11 does not extend to the piston 11 comprising the second portion 23*b* of the first structural layer 23 (membrane 111) and the separate portion of the second structural layer 25 (rigidifying structure 112). Within the periphery of the piston 11, the first sacrificial layer 22 (e.g. silicon oxide) serves as a stop layer in etching the substrate 21 (e.g. silicon), thereby preserving the second portion 23*b* of the underlying first structural layer 23 (e.g. silicon). This avoids creating significant air leakage between the back volume 12 (subject to the reference pressure) and the second cavity 13 open to the external environment (and thus subject to atmospheric pressure), on either side of the membrane 111.

Finally, in step S12 (cf. FIG. 4L), the first sacrificial layer 22 is etched so as to uncover the second portion 23*b* of the first structural layer 23 (in other words, so as to expose a second opposite face of the membrane 111) and to separate it from the substrate 21 (here only the second portion 22*b* of the first sacrificial layer 22 is etched). At the end of step S12, the piston 11 is free to move. Step S12 can therefore be referred as a second step of releasing the piston 11.

The etching of the first sacrificial layer 22 is in an embodiment an isotropic etching selective with respect to the substrate 21, the first structural layer 23 and the second structural layer 25. The first sacrificial layer 22 is in an embodiment etched chemically, for example by immersing the assembly in a hydrofluoric acid (HF) bath in the liquid or vapour phase (in the case of a silicon oxide layer) for a controlled time.

FIGS. 5A-5D represent steps in a method for manufacturing the cap 30 employed in the electroacoustic transducer 1 of FIGS. 2 and 3.

Figure 5A:
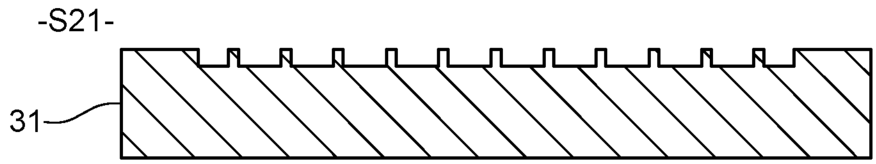
FIG. 5A to FIG. 5D represent a cross-section view of steps of a method for manufacturing a cap employed in the electroacoustic transducer of FIG. 2 or 3.

In a first step S21 represented in FIG. 5A, a second substrate 31 (in an embodiment made of semiconductor material, for example silicon) is etched so as to form a cavity 103*b* beneficially comprising pillars 104*b* or several cavities 103*b* separated (laterally) by partition walls. Each pillar 104*b* or partition wall is formed by a projecting portion of the substrate 31.

Figure 5B:
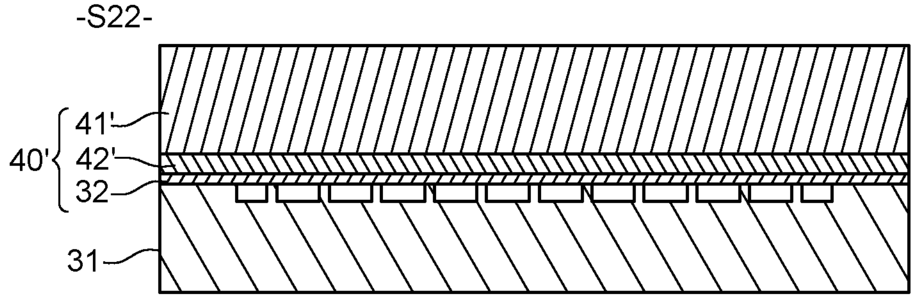
Figure 5C:
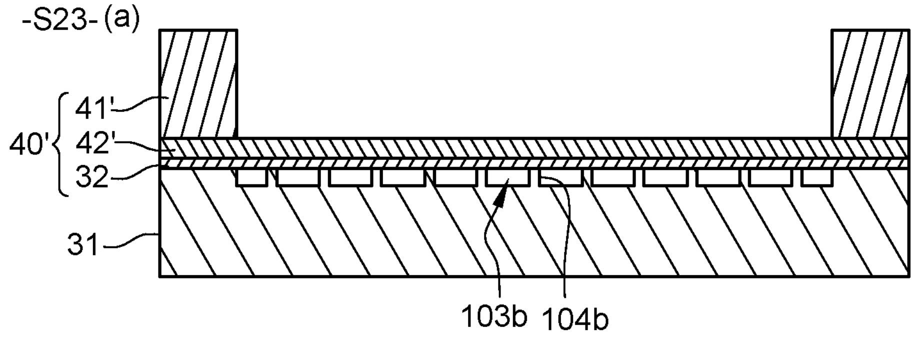
Figure 5D:
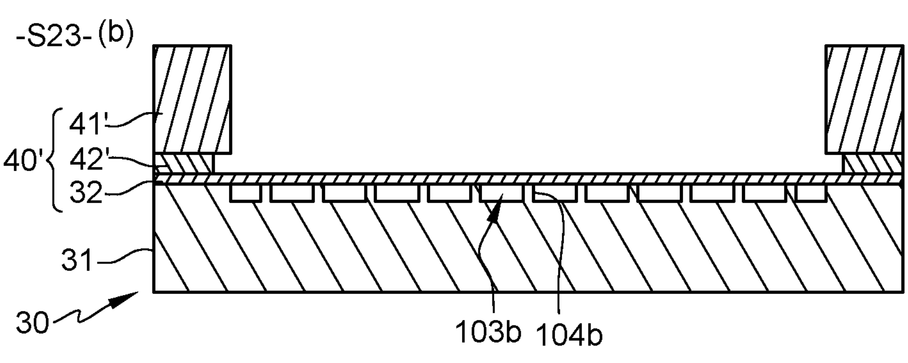

Then, in a second step illustrated in FIGS. 5B-5D, a third structural layer 32 is transferred to the substrate 21, so as to seal the cavity or cavities 103*b*.

Like the step of transferring the first structural layer 23 described in connection with FIGS. 4D-4E, the step of transferring the third structural layer 32 may comprise two sub-steps S22-S23:

- bonding S22 to the second substrate 31 a transfer substrate 40' (in an embodiment a multilayer SOI structure) comprising the third structural layer 32 (see FIG. 5B);
- thinning S23 the transfer substrate 40' down to the third structural layer 32, for example by etching or by grinding and CMP (see FIGS. 5C-5D).

The transfer substrate 40' is thinned down to the third structural layer 32 at least facing the cavity 104*b*. One or more portions of the transfer substrate 40' may be kept around the sealed cavity 104*b*, in order to increase the back volume 12. In the case of a multi-layer structure SOI, thinning S23 the transfer substrate 40' may be carried out in two successive operations illustrated by FIGS. 5C and 5D:

- S23 (*a*): etching the support layer 41' (typically silicon) of the multilayer structure down to the buried oxide layer 42' (typically $SiO_2$) (see FIG. 5C); and
- S23 (*b*): etching the buried oxide layer 42' selectively with respect to the third structural layer 32, in an embodiment by wet etching (for example HF) (see FIG. 5D).

More generally, the manufacturing method of FIGS. 5A-5D provides a structure 30 with one or more surface sealed cavities 103*b*. This structure may find other applications than the cap of the acoustic transducer 1.

To obtain the electroacoustic transducer 1 according to FIG. 3, the method for manufacturing the transducer according to FIGS. 4A-4L is implemented by transferring, in step S10 of FIG. 4J, a cap 30 obtained by implementing the method of FIGS. 5A-5D.

To obtain the electroacoustic transducer 1 according to FIG. 2, the steps of FIGS. 5A-5D are implemented to manufacture the cap 30 and an alternative to the method for manufacturing the transducer according to FIGS. 4A-4L is implemented.

The stack 20 used as a starting point for this alternative method comprises successively the substrate 21, the first sacrificial layer 22 and the first structural layer 23, but no sealed cavities 103*a* provided within the first sacrificial layer 22 (see FIG. 2). The first sacrificial layer 22 then extends over the entire surface of the substrate 21. Typically, the stack 20 may be a multilayer SOI-type structure.

The alternative method then does not include any of the steps S1-S5 aiming at forming the sealed cavity 103*a* (of the first wall 101), but merely a step of providing the stack 20. The second sacrificial layer 24 may not comprise the first portion 24*a* and the second structural layer 25 may not be etched out of the piston (although this is useful for enlarging the back volume 12).

The piston 11 may be devoid of a rigidifying structure 112. Steps S6 (forming the second sacrificial layer 24), S7 (forming the second structural layer 25), S8 (etching the second structural layer 25) and S9 (removing the second sacrificial layer 24) may then not be implemented.

Thus, more generally, the method for manufacturing an electroacoustic transducer according to an aspect of the invention comprises the following steps of:

- providing a stack 20 successively comprising the substrate 21, the first sacrificial layer 22 and the first structural layer 23;
- etching the first structural layer 23 down to the first sacrificial layer 22 so as to delimit the membrane 111 of the movable element 11;
- transferring a cap 30 onto the first structural layer 23, thereby forming the back volume 12;
- etching the substrate 21 to access the first sacrificial layer 22;
- etching the first sacrificial layer 22 so as to release the membrane 111;

at least one sealed cavity 103*a*, 103*b* being formed in a portion of the first sacrificial layer 22 and/or in the cap 30.

The method manufacturing has been further described using a capacitive detection microphone as an example, one face of which is subjected to atmospheric pressure and the other face subjected to a reference pressure. The manufacturing method is, however, applicable to other types of microphone and other types of electroacoustic transducer, especially a loudspeaker (sound emitter) or an ultrasound emitter.

More generally, a microphone comprises in the second zone (controlled atmosphere chamber) means for measuring movement of the transmission device and/or force applied to the transmission device. These measurement means comprise for example a vibrating beam (resonating beam microphone).

In the case of a loudspeaker or ultrasonic transmitter, an actuator (for example capacitive actuator) replaces the measurement means in the second zone. The actuator moves the first end of the second transmission arm. This movement is transmitted by the transmission device to the piston 11 secured to the first end of the first transmission arm 14. The movement of the membrane 111 of the piston 11 enables the emission of sound (or ultrasound).

It will be appreciated that the various embodiments described previously are combinable according to any technically permissible combinations.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The invention claimed is:

1. An electroacoustic transducer comprising:

a frame comprising a support, a first portion of a first structural layer disposed on the support and a cap disposed on the first portion of the first structural layer, the first structural layer having a thickness of less than 2 μm;

an element movable relative to the frame, the movable element comprising a membrane, and an internal cavity forming a back volume, subjected to a reference pressure and delimited by the movable element and first and second walls belonging to the frame, the first wall being located as an extension of the membrane and the second wall being arranged facing the membrane, wherein the first wall comprises at least one sealed cavity separated from the back volume by the first portion of the first structural layer and wherein a pressure lower than the reference pressure prevails in said at least one sealed cavity of the first wall.

2. The electroacoustic transducer according to claim 1, wherein the pressure in said at least one sealed cavity is less than or equal to 1000 Pa.

3. The electroacoustic transducer according to claim 2, wherein the pressure in said at least one sealed cavity is less than or equal to 100 Pa.

4. The electroacoustic transducer according to claim 1, wherein the membrane is formed by a second portion of the first structural layer.

5. The electroacoustic transducer according to claim 1, wherein the second wall comprises at least one sealed cavity, wherein a pressure lower than the reference pressure prevails in said at least one sealed cavity of the second wall and wherein said at least one sealed cavity of the second wall is located in the cap and separated from the back volume by a third structural layer with a thickness of less than 2 μm.

6. The electroacoustic transducer according to claim 1, wherein at least one of the first and second walls delimiting the back volume comprises a single sealed cavity, the single sealed cavity comprising pillars with a width of between 500 nm and 50 μm.

7. The electroacoustic transducer according to claim 1, wherein at least one of the first and second walls delimiting the back volume comprises a plurality of sealed cavities separated from each other by partition walls having a width between 500 nm and 50 μm.

8. The electroacoustic transducer according to claim 1, wherein the first portion of the first structural layer separating the at least one sealed cavity of the first wall from the back volume, and the membrane, are formed from the first structural layer.

9. A method for manufacturing an electroacoustic transducer comprising:

a frame comprising a support, a first portion of a first structural layer disposed on the support and a cap disposed on the first portion of the first structural layer, the first structural layer having a thickness of less than 2 μm;

an element movable relative to the frame, the movable element comprising a membrane, and an internal cavity forming a back volume, subjected to a reference pressure and delimited by the movable element and first and second walls belonging to the frame, the first wall being located as an extension of the membrane and the second wall being arranged facing the membrane;

the method comprising:

providing a stack successively comprising a substrate, a first sacrificial layer and the first structural layer having a thickness less than 2 μm;

etching the first structural layer down to the first sacrificial layer so as to delimit the membrane of the movable element;

transferring the cap onto the first structural layer, thus forming the back volume;

etching the substrate to access the first sacrificial layer, and etching the first sacrificial layer so as to release the membrane;

wherein the at least one sealed cavity is formed in a portion of the first sacrificial layer, so as to be located in the first wall delimiting the back volume, said at least one sealed cavity of the first wall being separated from the back volume by the first portion of the first structural layer and a pressure lower than the reference pressure prevails in said at least one sealed cavity of the first wall.

10. The method according to claim 9, wherein the substrate is etched to delimit a transmission arm, the movable element being coupled to one end of the transmission arm, the first sacrificial layer serving as a stop layer in etching the substrate.

11. The method according to claim 9, further comprising, after providing the stack and before transferring the cap:

forming a second sacrificial layer on the first structural layer;

forming a second structural layer on the first structural layer and on the second sacrificial layer;

etching the second structural layer so as to expose the second sacrificial layer and to delimit a structure for rigidifying the membrane, and etching the second sacrificial layer so as to expose the membrane.

12. The method according to claim 11, wherein the first structural layer and the second structural layer are etched simultaneously so as to delimit the membrane and the rigidifying structure of the movable element.

13. The method according to claim 9, wherein providing the stack comprises:

etching first and second disjointed cavities in the substrate;

forming the first sacrificial layer on the substrate, the first sacrificial layer comprising a first portion disposed in the first cavity and a second portion disposed in the second cavity;

etching at least one third cavity in the first portion of the first sacrificial layer, and transferring the first structural layer onto the first and second portions of the first sacrificial layer, so as to seal said at least one third cavity.

14. The method according to claim 9, further comprising providing the cap that includes:

etching at least one fourth cavity in an additional substrate, and transferring a third structural layer onto the additional substrate, so as to seal said at least one fourth cavity.

* * * * *